(12) United States Patent
Horng et al.

(10) Patent No.: US 6,497,273 B1
(45) Date of Patent: Dec. 24, 2002

(54) FIXING STRUCTURE OF RADIATOR

(75) Inventors: Alex Horng, Kaohsiung (TW); Jessica Hsiao, Kaohsiung (TW)

(73) Assignee: Sunonwealth Electric Machine Industry Co., Ltd., Kaohisung (TW)

( * ) Notice: Subject to any disclaimer, the term of this patent is extended or adjusted under 35 U.S.C. 154(b) by 0 days.

(21) Appl. No.: 09/964,707

(22) Filed: Sep. 28, 2001

(51) Int. Cl.[7] .................................. H05K 7/20
(52) U.S. Cl. ................ 165/80.3; 165/121; 165/185; 174/16.3; 257/719; 361/697
(58) Field of Search ................ 165/80.3, 121, 165/122, 185; 174/16.3; 257/718, 719, 722; 361/695, 697, 704, 719

(56) References Cited

U.S. PATENT DOCUMENTS

| | | | | |
|---|---|---|---|---|
| 5,522,700 A | * | 6/1996 | Hong | 361/697 |
| 5,603,374 A | * | 2/1997 | Wu | 165/80.3 |
| 6,105,215 A | * | 8/2000 | Lee | 165/80.3 |
| 6,282,091 B1 | * | 8/2001 | Horng | 361/697 |
| 6,434,002 B1 | * | 8/2002 | Wei | 361/697 |

* cited by examiner

Primary Examiner—Leonard Leo
(74) Attorney, Agent, or Firm—Bacon & Thomas

(57) ABSTRACT

A fixing structure of a radiator includes a base plate, and a heat-sink seat to form a radiator. The base plate is provided with a combination tube defining a through hole. The heat-sink seat is provided with an ear plate that defines a hole aligning with the through hole of the combination tube for passage of a snap connecting rod which has a first end provided with a cap head, and a second end provided with a snap connecting portion. The snap connecting portion may pass through the through hole of the base plate and the hole of the ear plate, and may be locked and snapped on the other side edge of the positioning hole of a fixing plate.

4 Claims, 3 Drawing Sheets

FIXING STRUCTURE OF RADIATOR

BACKGROUND OF THE INVENTION

1. Field of the Invention

The present invention relates to a fixing structure of a radiator, and more particularly to a fixing structure of a radiator, wherein the radiator may be conveniently combined with a fixing plate that has a positioning hole, and may be conveniently detached from the fixing plate without breaking the body of the radiator.

2. Description of the Related Art

A conventional radiator in accordance with the prior art shown in FIG. 1 is fixed in a fixing structure having a central processor, and comprises a fixing plate 90 provided with a plurality of positioning holes 91, and a base plate 92 having one surface provided with a plurality of upright combination posts 93. Each combination post 93 has a cone-shaped combination portion 94 whose diameter is greater than that of each combination post 93, and the combination portion 94 is provided with a through hole 95. The combination portion 94 may be compressed to pass through each positioning hole 97 of a radiator seat 96 and each positioning hole 91 of the fixing plate 90, so that the radiator may be fixed and combined with the fixing plate 90 having a central processor.

After each combination post 93 of the base plate 92 is snapped in the positioning hole 91 of the fixing plate 90, it is necessary to cut and break each combination post 93 so as to detach the base plate 92. Thus, the radiator cannot be used again. Therefore, according to the fixing manner of the base plate 92 of the radiator and the fixing plate 90, after they are combined and fixed, they cannot be detached and used. In addition, each combination post 93 protrudes outward from the base plate 92. Thus, each combination post 93 is easily broken due to hit or collision, so that the entire radiator cannot be used.

SUMMARY OF THE INVENTION

The primary objective of the present invention is to provide a fixing structure of a radiator, wherein the radiator may be conveniently combined on a fixing article, and may be conveniently detached from the fixing article for the next use without breaking the body of the radiator, thereby decreasing the consumption so as to reduce the cost.

In accordance with the present invention, there is provided a fixing structure of a radiator including a base plate, and a heat-sink seat to form a radiator. The base plate of the radiator is provided with an impeller that may be rotated to drive the air to flow. The base plate is provided with at least one combination tube which has a through hole. The heat-sink seat is provided with at least one ear plate that defines a hole. The through hole of the combination tube may align with the hole of the ear plate for passage of at least one snap connecting rod. The snap connecting rod has a first end provided with a cap head, and a second end provided with a cone-shaped snap connecting portion. The greatest outer diameter of the snap connecting portion being greater than a diameter of the snap connecting rod and the positioning hole of the fixing plate. The snap connecting portion may pass through the through hole of the base plate and the hole of the ear plate, and may be locked and snapped on the other side edge of the positioning hole of a fixing plate.

Further benefits and advantages of the present invention will become apparent after a careful reading of the detailed description with appropriate reference to the accompanying drawings.

DETAILED DESCRIPTION OF THE PREFERRED EMBODIMENTS

Figure 1:
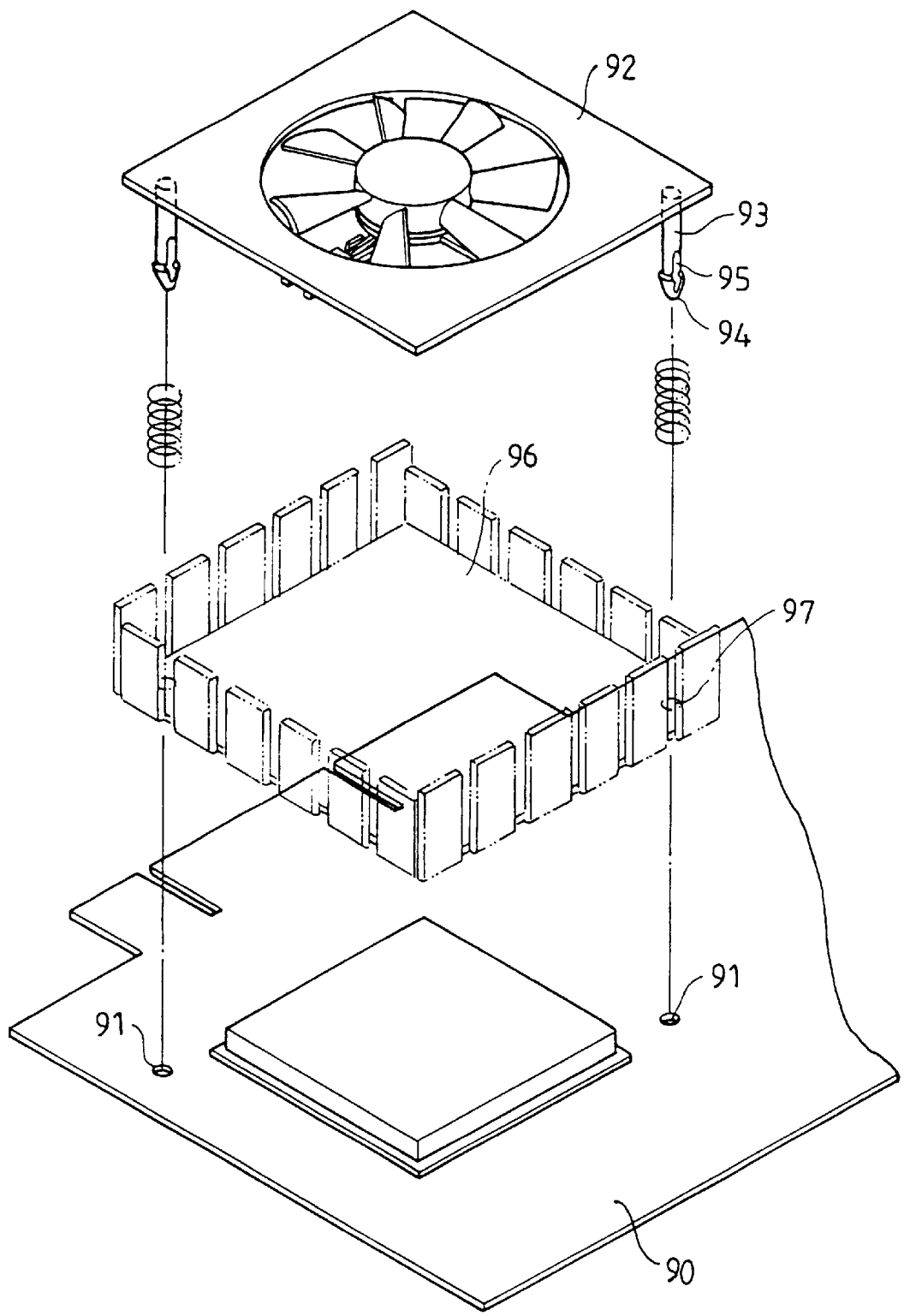
FIG. 1 is an exploded perspective view of a conventional radiator in accordance with the prior art.
Figure 2:
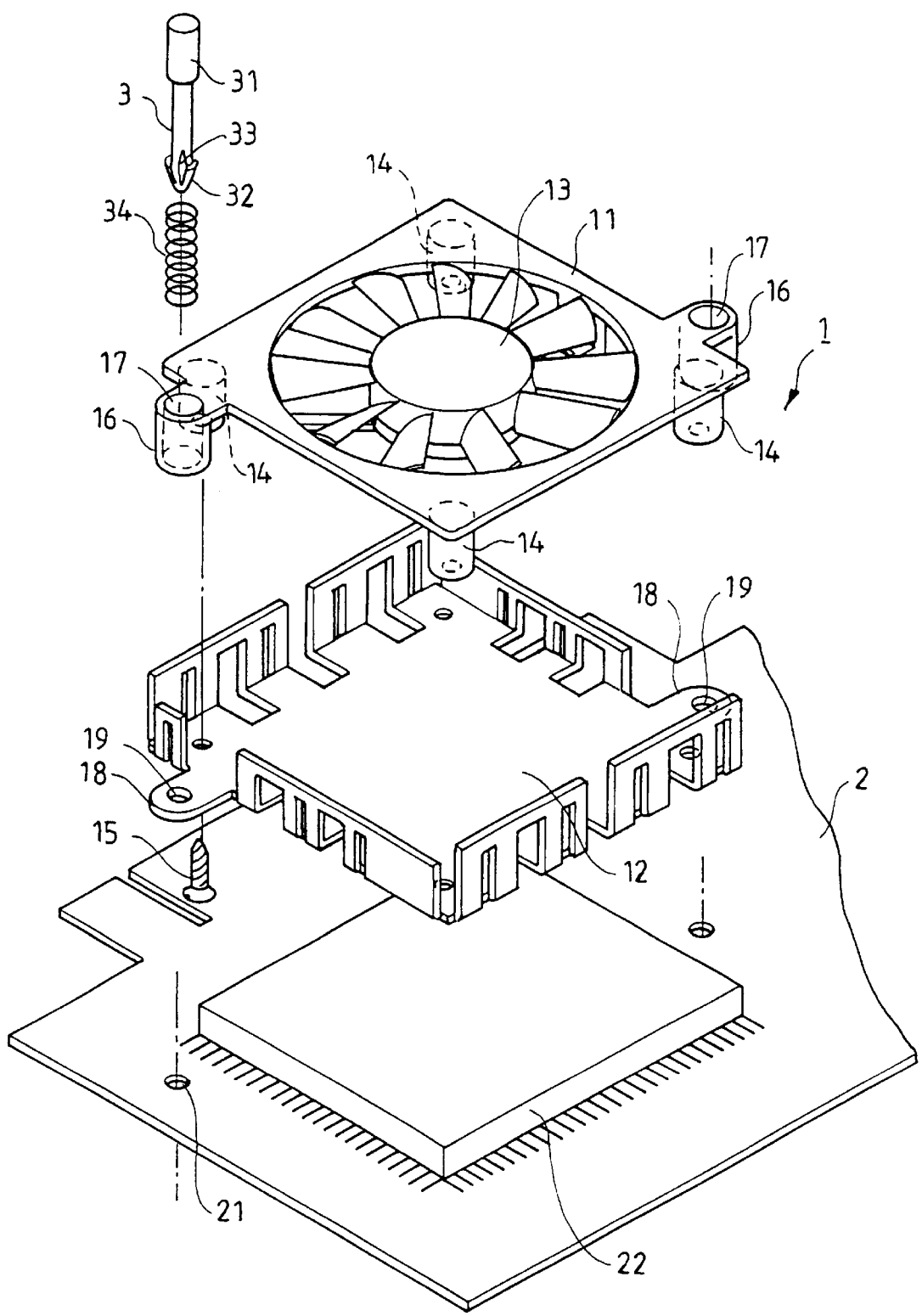
FIG. 2 is an exploded perspective view of a fixing structure of a radiator in accordance with a first embodiment of the present invention.

Referring to the drawings and initially to FIG. 2, the structure in accordance with a first embodiment of the present invention comprises a radiator 1, a fixing plate 2, and at least one snap connecting rod 3.

The fixing plate 2 may be a conventional circuit board or various fixture, and may be provided with a heat emitting member 22 such as a central processor. The fixing plate 2 is provided with a plurality of positioning holes 21.

The radiator 1 includes a base plate 11, a heat-sink seat 12, and an impeller 13. The impeller 13 may be mounted on the base plate 11, and may be rotated to drive the air to flow. The base plate 11 is provided with at least one column 14 whose one end is rested on the heat-sink seat 12, so that the base plate 11 and the heat-sink seat 12 may maintain a determined distance. The column 14 may preferably be provided with a positioning hole so that the base plate 11 may be combined with the heat-sink seat 12 by a positioning member 15 such as a screw.

The base plate 11 is provided with at least one combination tube 16 which has a through hole 17 whose inner diameter is adapted to be a single diameter. The through hole 17 may allow passage and positioning of a snap connecting rod 3.

The heat-sink seat 12 is provided with at least one protruding ear plate 18 which defines a hole 19 aligning with the through hole 17 of the base plate 11. The hole 19 may allow passage of the snap connecting rod 3, so that the base plate 11 may be combined and positioned with the heat-sink seat 12.

The snap connecting rod 3 has a first end provided with a cap head 31, and a second end provided with a snap connecting portion 32 that may be formed to have a cone-shape. The greatest outer diameter of the cone-shaped snap connecting portion 32 is greater than the diameter of the snap connecting rod 3 and the positioning hole 21. The snap connecting portion 32 is provided with a through slot 33, so that the snap connecting portion 32 may initially be compressed to have a smaller outer diameter, so as to pass through the hole 19 of the ear plate 18 and the positioning hole 21 of the fixing plate 2, and may then be returned to the original larger outer diameter, thereby snapping the other side edge of the positioning hole 21 of the fixing plate 2. An elastic member 34 may be mounted on the snap connecting rod 3, and has a first end rested on the cap head 31, and a second end rested on the edge of the hole 19 of the ear plate 18, so that the snap connecting portion 32 may be snapped on the other side edge of the positioning hole 21 of the fixing plate 2 rigidly, and so that the entire radiator 1 may be combined on the fixing plate 2 stably and rigidly.

Figure 3:
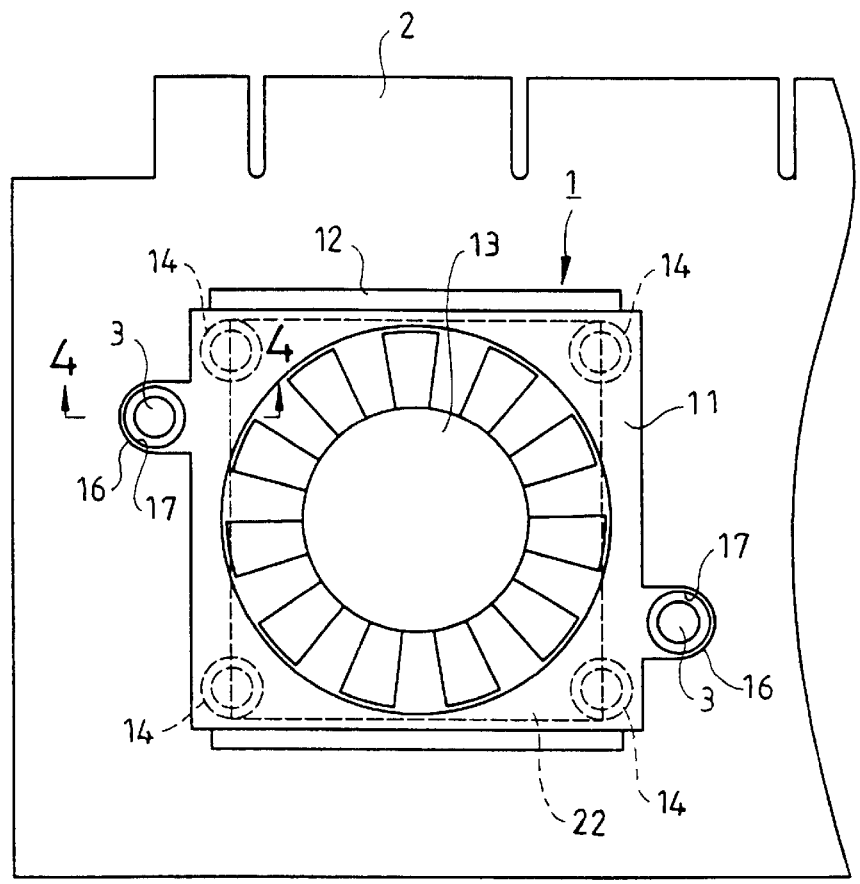
FIG. 3 is a top plan assembly view of the fixing structure of a radiator as shown in FIG. 2.
Figures 4, 5:
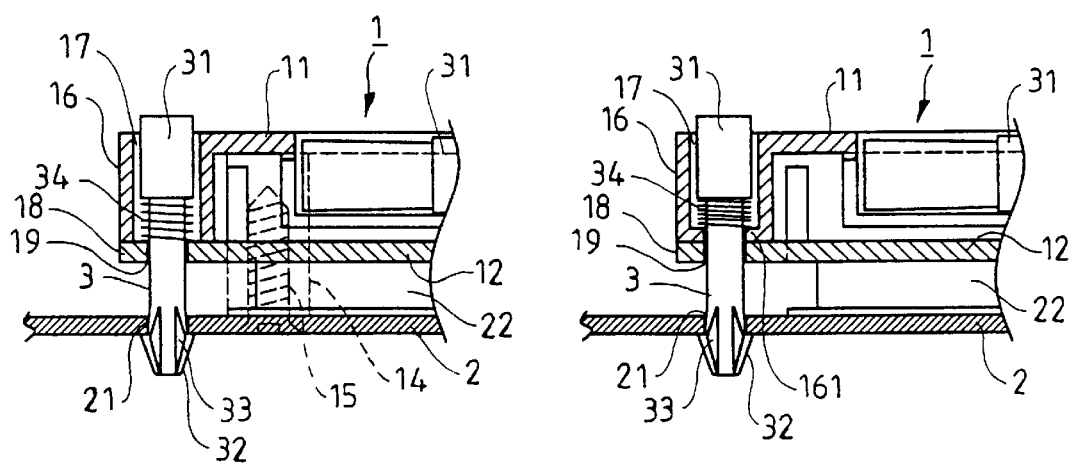
FIG. 4 is a cross-sectional view of the fixing structure of a radiator along line 4—4 as shown in FIG. 3.
FIG. 5 is a cross-sectional assembly view of the fixing structure of a radiator in accordance with a second embodiment of the present invention as shown in FIG. 4.

Referring to FIGS. 3 and 4, the preferred example in accordance with the present invention is shown. The base plate 11 and the heat-sink seat 12 are combined to form a radiator 1. The combination tube 16 of the base plate 11 is aligned with the hole 19 of the heat-sink seat 12, and is also aligned with the positioning hole 21 of the fixing plate 2 simultaneously. The snap connecting rod 3 fitted with the elastic member 34 is placed into the combination tube 16. The snap connecting rod 3 is then pressed, whereby the snap connecting portion 32 may pass through the positioning hole 21 of the fixing plate 2, so that the radiator 1 may be snapped on the other side edge of the positioning hole 21 of the fixing plate 2. Thus, the radiator 1 may be combined with the fixing plate 2. When the user wishes to separate the radiator 1 from the fixing plate 2, the snap connecting portion 32 of the snap connecting rod 3 may be cut off, so that the cap head 31 of the snap connecting rod 3 may be elastically lifted to protrude outward from the combination tube 16, thereby facilitating removing the cap head 31. Therefore, the radiator 1 may be separated from the fixing plate 2 without any damage. Thus, the detachment will break the snap connecting rod 3 only, without breaking the body of the radiator 1, thereby decreasing the cost of consumption.

Referring now to FIG. 5, in accordance with a second embodiment of the present invention, the inner wall of the through hole 17 of the combination tube 16 of the base plate 11 of the radiator 1 is formed with a protruded flange 161 on which one end of the elastic member 34 (which is mounted on the snap connecting rod 3) is rested. Thus, the base plate 11 and the heat-sink seat 12 of the radiator 1 may be combined without needing the screw. The user only needs to align the through hole 17 of the radiator 1 with the positioning hole 21 of the fixing plate 2, and then presses the snap connecting rod 3 that has been combined and positioned in the through hole 17 of the radiator 1, so that the snap connecting portion 32 of the snap connecting rod 3 may be guided by the through hole 17 to move downward to pass through and protrude from the positioning hole 21 of the fixing plate 2. Thus, the radiator 1 may be combined with the fixing plate 2 easily, so that the assembling process is convenient.

Accordingly, in accordance with the structure of the present invention, the radiator may be combined with the fixing plate easily. When the user wishes to separate the radiator from the fixing plate, the radiator may be separated from the fixing plate by breaking the snap connecting rod without having to break the body of the radiator. Thus, the loss is generally smaller, thereby decreasing the cost of consumption of the parts of the radiator.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A radiator structure, comprising:

a radiator, including a base plate, a heat-sink seat, and an impeller, said impeller capable of being rotated to drive air to flow, said base plate provided with at least one combination tube which has a through hole, said heat-sink seat having at least one ear plate that defines a hole;

at least one snap connecting rod, fitted with an elastic member, and having a first end provided with a cap head, and a second end provided with a snap connecting portion, the greatest outer diameter of said snap connecting portion being greater than a diameter of said snap connecting rod and said hole of said ear plate, said snap connecting portion having elasticity that may be compressed;

said snap connecting rod fitted with said elastic member being passed through said combination tube of said radiator and said hole of said ear plate to be positioned.

2. The radiator structure as claimed in claim 1, wherein at least one column is mounted between said base plate and said heat-sink seat, and has a positioning hole so that said base plate and said heat-sink seat may be combined by a positioning member.

3. The radiator structure as claimed in claim 1, wherein an inner wall of said through hole of said combination tube is formed with a protruded flange, and said elastic member which is mounted on said snap connecting rod has one end rested on said flange.

4. A fixing structure of a radiator, comprising:

a radiator, including a base plate, a heat-sink seat, and an impeller, said impeller capable of being rotated to drive air to flow, said base plate provided with at least one combination tube which has a through hole, said heat-sink seat having at least one ear plate that defines a hole;

at least one snap connecting rod, fitted with an elastic member, and having a first end provided with a cap head, and a second end provided with a snap connecting portion, the greatest outer diameter of said snap connecting portion being greater than a diameter of said snap connecting rod and said hole of said ear plate, said snap connecting portion having elasticity that may be compressed;

a fixing plate, having at least one positioning hole, a diameter of said positioning hole being slightly smaller than the greatest outer diameter of said snap connecting portion;

said snap connecting rod fitted with said elastic member being passed through said combination tube of said radiator and said hole of said ear plate to be positioned, said snap connecting portion of said snap connecting rod capable of passing through said positioning hole of said fixing plate, and said snap connecting portion of said snap connecting rod being locked and snapped on an edge of another side of said positioning hole of said fixing plate, so that said radiator is fixed and combined on said fixing plate.

* * * * *